United States Patent [19]

Tanaka et al.

[11] Patent Number: 4,555,532
[45] Date of Patent: Nov. 26, 1985

[54] EPOXY RESIN COMPOSITION

[75] Inventors: Isamu Tanaka, Yokosuka; Hiroshi Kikuchi, Zushi; Akira Tomizawa; Hitoshi Oka, both of Yokohama, all of Japan

[73] Assignee: Hitachi, Ltd., Tokyo, Japan

[21] Appl. No.: 659,565

[22] Filed: Oct. 10, 1984

[30] Foreign Application Priority Data

Oct. 14, 1983 [JP] Japan ................................ 58-190756
Jul. 13, 1984 [JP] Japan ................................ 59-144240

[51] Int. Cl.$^4$ .......................... C08L 63/00; C09D 3/58
[52] U.S. Cl. .................................... 523/400; 523/440; 523/443; 525/504; 528/117; 528/118
[58] Field of Search .................... 523/400, 440, 443; 525/504; 528/117, 118

[56] References Cited

U.S. PATENT DOCUMENTS

| 4,205,156 | 5/1980 | Sawa et al. | 528/117 |
| 4,460,718 | 7/1984 | Tanaka et al. | 523/400 |

FOREIGN PATENT DOCUMENTS

| 5013498 | 6/1973 | Japan | 528/117 |
| 5031000 | 7/1973 | Japan | 528/117 |
| 53-127540 | 11/1978 | Japan | 523/440 |
| 57-195117 | 11/1982 | Japan | 523/440 |

Primary Examiner—Ronald W. Griffin
Attorney, Agent, or Firm—Antonelli, Terry & Wands

[57] ABSTRACT

An epoxy resin composition containing as a latent hardener a diaminotriazine-modified imidazole compound and dicyandiamide is improved in the usable life of an solder resist ink composition and can give a solder resist also excellent in resistance to an electroless plating bath.

26 Claims, 1 Drawing Figure

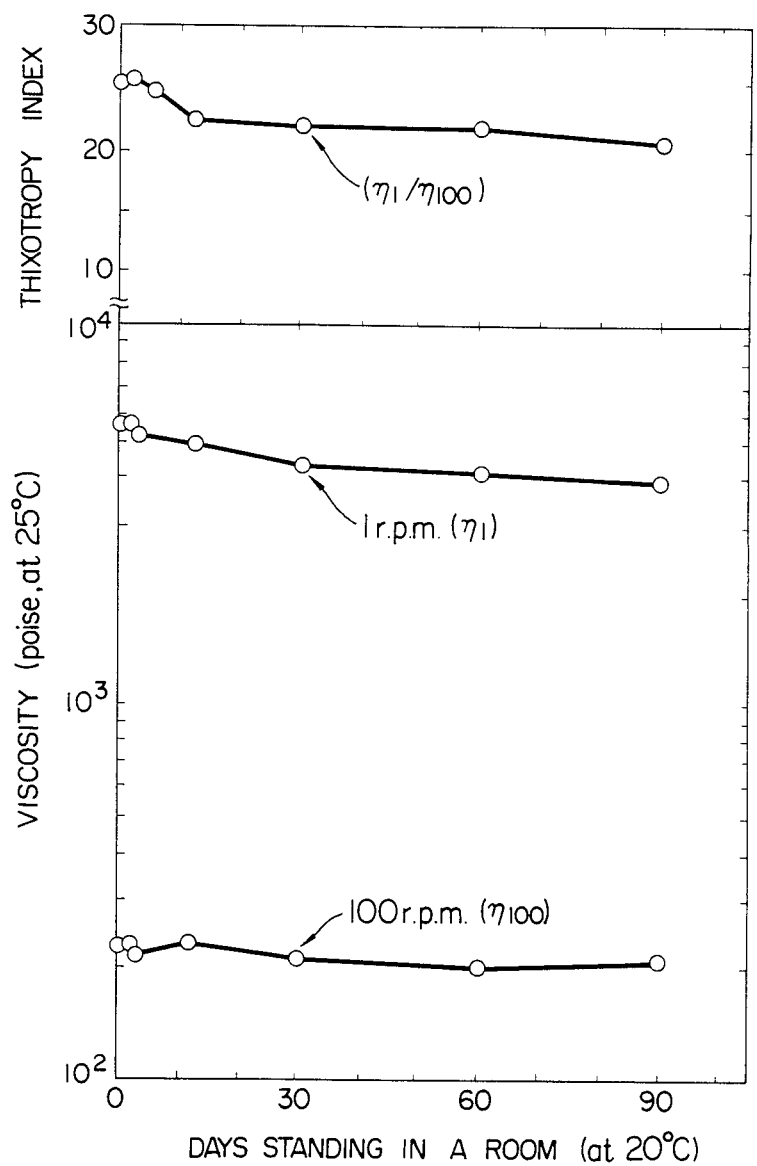

EPOXY RESIN COMPOSITION

BACKGROUND OF THE INVENTION

This invention relates to an epoxy resin composition, and particularly to an epoxy resin composition suitable for forming a solder resist having resistance to electroless plating bath.

Formation of circuit patterns on substrates by electroless copper plating has been conducted, for example, by the following steps (1) to (5):

(1) through-holes are formed in a double-side copper-clad laminate, (2) $PdCl_2$ catalyst which is to become a nucleus for plating is coated, (3) a circuit pattern is formed by etching, (4) a resist layer is formed on portions other than the through-holes and lands, and (5) electroless copper plating is conducted on the through-holes and the lands by immersing the laminate in a strongly alkaline electroless copper plating bath heated at 60° to 80° C. with a pH of 12–13.

In such a process, when an epoxy resin composition comprising an epoxide compound, an epoxy-modified guanidine compound obtained by modifying 1-o-tolyl-biguamide with an epoxy compound, a filler, a thixotropic agent, an organic solvent, and if necessary an anti-foaming agent is used for forming the resist (U.S. Pat. No. 4,460,718), the usable life (after mixing the major components and a hardener until screen printing of the composition) is as short as about 4 hours and the time of preventing the resist from the corrosion by an electroless copper plating bath is about 20 hours. Therefore, the improvement in both the usable life and the resistance to electroless plating bath has been desired.

SUMMARY OF THE INVENTION

It is an object of this invention to provide an epoxy resin composition suitable for forming a solder resist having excellent resistance to electroless plating bath and having the usable life of as long as 40 hours or more.

This invention provides an epoxy resin composition comprising (a) 100 parts by weight of an epoxide compound having more than one epoxy group on the average per molecule, (b) 1 to 20 parts by weight of a diaminotriazine-modified imidazole compound represented by the formula:

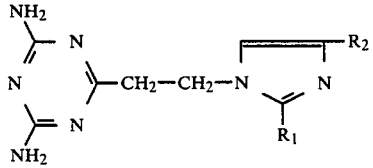

wherein $R_1$ is an alkyl group having 1 to 20 carbon atoms or a phenyl group; and $R_2$ is a hydrogen atom or a lower alkyl group, or an acid adduct thereof, (c) dicyandiamide in an amount of 0.2 to 2.0 equivalent weight per epoxy equivalent weight of the epoxide compound (a), (d) 3 to 40 parts by weight of a filler, (e) 0.5 to 10 parts by weight of an anti-foaming agent, (f) a thixotropic agent in an amount of making a thixotropy index of the whole composition 5 to 40 and a viscosity of the whole composition 800 to 10,000 poises when measured by using a B type rotational viscometer at a rotational rate of 1 rpm at 20° C., and, if necessary, (g) 0.1 to 8 parts by weight of a phenolic compound.

BRIEF DESCRIPTION OF THE DRAWING

The attached drawing is a graph showing storage stability (the usable life) of a plating and solder resist ink obtained by using the epoxy resin composition of this invention (Example 4).

DESCRIPTION OF THE PREFERRED EMBODIMENTS

The epoxy resin composition of this invention is characterized by using as a special hardener the diaminotriazine-modified imidazole compound of the formula (I) and dicyandiamide. Further, when a thixotropic agent surface treated with silicone oil is used together with a phenolic compound, the performance is further improved.

As the epoxide compound having more than one epoxy group on the average per molecule, there can be used epoxide compounds having more than one epoxy group on the average, preferably two or more epoxy groups, per molecule and liquid at normal temperatures. Examples of the epoxide compounds are polyglycidyl ethers or polyglycidyl esters obtained by reacting epichlorohydrin with a polyhydric phenol such as bisphenol A, halogenated bisphenol A, bisphenol F, catechol, resorcinol or the like or a polyhydric alcohol such as glycerol or the like in the presence of a basic catalyst; epoxy novolaks obtained by condensing a novolak type phenolic resin with epichlorohydrin; epoxidized polyolefins, epoxidized polybutadiene, or epoxidized vegetable oils, obtained by epoxidation by a peroxidation method; and the like. Commercially available such epoxy compounds are epoxy novolak resins such as DEN 431 (Dow Chemical Co., Ltd.), and Epikote 152 (Shell Chemical Co., Ltd.), bisphenol ether type epoxy resins such as Epikote 807, 828 (Shell Chemical Co., Ltd.), bisphenol ester type epoxy resins such as Showdain 508 (Showa Denko Co., Ltd.). These epoxide compounds can be used alone or as a mixture thereof.

The diaminotriazine-modified imidazole compound is represented by the formula:

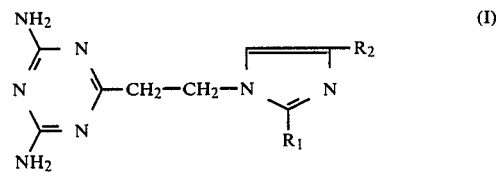

or an acid adduct thereof and is hardly dissolvable in the epoxide compound (a) at normal temperatures. Therefore, the imidazole compound of the formula (I) or an acid adduct thereof has latent curing properties for the epoxide compound (a).

In the formula (I), $R_1$ is an alkyl group having 1 to 20 carbon atoms or a phenyl group. The alkyl group can be a straight-chain or branched chain alkyl group. Preferable examples of such an alkyl group are $-CH_3$, $-C_2H_5$, $-CH(CH_3)_2$, $-C_4H_9$, $-C_5H_{11}$, $-C_6H_{13}$, $-C_7H_{15}$, $-C_8H_{17}$, $-C_9H_{19}$, $-C_{10}H_{21}$, $-C_{11}H_{23}$ and $-C_{17}H_{35}$. $R_2$ in the formula (I) is a hydrogen atom or a lower alkyl group preferably having 1 to 4 carbon atoms. Among them, a methyl group and an ethyl group are more preferable.

Preferable examples of the imidazole compounds of the formula (I) or acid adducts thereof are:

2,4-diamino-6{2'-methylimidazole-(1')}ethyl-s-triazine, 2,4-diamino-6{2'-ethyl-4'-methylimidazole-(1')}ethyl-s-triazine, 2,4-diamino-6{2'-undecylimidazole-(1')}ethyl-s-triazine, and 2,4-diamino-6{2'-methylimidazole-(1')}ethyl-s-triazine.isocyanuric acid adduct.

The acid component used for forming an acid adduct of the imidazole compound of the formula (I) includes methyl isocyanurate, ethyl isocyanurate, propyl isocyanurate, butyl isocyanurate, and the like.

The imidazole compounds of the formula (I) can be used alone or as a mixture thereof.

The imidazole compound of the formula (I) or an acid adduct thereof is used in an amount of 1 to 20 parts by weight per 100 parts by weight of the epoxide compound (a). If the amount is less than 1 part by weight, no effect is obtained. On the other hand, if the amount is more than 20 parts by weight, the resist film becomes soft, and is swollen and whitened when immersed in an electroless plating bath. Further, heat resistance of the resist film is lowered and blisters are produced at the time of soldering.

The component (c), dicyandiamide, is hardly dissoluble in the epoxide compound (a) at normal temperatures. Therefore, dicyandiamide has latent curing properties for the epoxide compound (a).

Dicyandiamide is used in an amount of 0.2 to 2.0 equivalent weight per equivalent weight of the epoxide compound (a). When the amount is less than 0.2 equivalent weight, no effect is obtained as to the resistance to electroless plating bath. On the other hand, when the amount is more than 2.0 equivalent weight, dicyandiamide is released from the resist film when immersed in an electroless plating bath, which results in stopping the electroless plating reaction.

In this invention, it is necessary to use both the component (b), the imidazole compound of the formula (I), and the component (c), dicyandiamide, as the hardener. When dicyandiamide is used alone as a hardener, although the pot life is long, a printed circuit substrate is warped largely due to the high temperature (180° C. or higher) necessary for the curing, which results in making it impossible to use practically. On the other hand, when the imidazole compound of the formula (I) is used alone as a hardener, the curing can be conducted at a temperature of 130° C. or lower, which temperature does hardly bring about warpage of the printed circuit substrate, but adhesiveness to a copper foil is poor and resistance to electroless plating is lowered. But it is a very surprising thing that when these components (b) and (c), that is, the imidazole compound of the formula (I) and dicyandiamide, are used together, the above-mentioned disadvantages are overcome and the usable life of the epoxy resin composition can remarkably be prolonged.

As the component (d), filler, there can be used fine powders of talc, mica, alumina, barium sulfate, silica ($SiO_2$), titanium oxide ($TiO_2$) and the like. These fillers can be used alone or as a mixture thereof. The average particle size of the filler is preferably 10 $\mu$m or less. The filler has functions of improving printing properties of the solder resist ink and enhancing mechanical properties of the resist film.

The filler is used in an amount of 3 to 40 parts by weight per 100 parts by weight of the epoxide compound (a). When the amount is more than 40 parts by weight, film forming properties become worse. On the other hand, when the amount is less than 3 parts by weight, there is no effect for improving the properties.

The anti-foaming agent (e) is effective for removing foams included at the time of printing the solder resist ink. Examples of the anit-foaming agent are conventionally used silicone oils, more concretely, polyphenylsiloxanes, etc.

The anti-foaming agent is used in an amount of 0.5 to 10 parts by weight, preferably 0.5 to 5 parts by weight per 100 parts by weight of the epoxide compound (a). When the amount is less than 0.5 part by weight, the anti-foaming effect is little, while when the amount is more than 10 parts by weight, the resistance to electroless plating bath is lowered.

The thixotropic agent (f) is used for improving the printing properties of a solder resist ink. As the thixotropic agent, there can be used inorganic ultrafine powders of $SiO_2$, $Al_2O_3$, etc., having a particle size of 0.1 $\mu$m or less. These ultrafine powders of $SiO_2$ and $Al_2O_3$ can be surface treated with a surface treating agent such as a silicone oil. When the surface treated thixotropic agent is used, it is preferable to add (g) a phenolic compound to the epoxy resin composition of this invention.

The thixotropic agent is used in an amount sufficient to make a thixotropy index of the whole composition (the components (a) through (f), or the components (a) through (g) when the surface treated anti-foaming agent being used) 5 to 40 and a viscosity of the whole composition 800 to 10,000 poises when measured by using B type rotational viscometer at a rotational rate of 1 r.p.m. at 20° C.

The thixotropy index means a ratio of the viscosity measured at the number of revolutions of 1 r.p.m. ($\eta_1$) to the viscosity measured at the number of revolutions of 100 r.p.m. ($\eta_{100}$), i.e. $\eta_1/\eta_{100}$.

The phenolic compound (g) is used together with the surface treated thixotropic agent and is effective for further improving the usable life compared with the case not using the phenolic compound because of trapping of amino groups of the hardeners (b) and (c) which have dissolved in the epoxide compound (a). Examples of the phenolic compound are phenol, dihydric phenols such as catechol, resorcinol and hydroquinone, trihydric phenols such as pyrogallol, hydroxyhydroquinone, and phloroglucinol. These phenolic compounds can be used alone or as a mixture thereof.

The phenolic compound is used in an amount of 0.1 to 8 parts by weight per 100 parts by weight of the epoxide compound (a). When the amount is less than 0.1 part by weight, there can be obtained no effect, while when the amount is more than 8 parts by weight, the solder resist film obtained is lowered in properties.

The epoxy resin composition of this invention may further contain one or more colorants such as pigments (e.g., phthalocyanine blue, phthalocyanine green), etc.

The above-mentioned components are kneaded in a mixing and griding machine and further kneaded by using a three-roll mill to give a solventless one-liquid type (100% solids, single component) solder resist ink excellent in resistance to electroless plating bath. The resulting solder resist ink has a very prolonged usable life and the resist film obtained from said resist ink is excellent both in resistance to solder and resistance to electroless plating bath.

This invention is illustrated by way of the following Examples, in which all parts and percents are by weight unless otherwise specified.

EXAMPLE 1

| | |
|---|---|
| Epikote 807 (bisphenol F type epoxy resin, mfd. by Shell Chemical Co., Ltd., epoxy equivalent weight 170) | 100 parts |
| 2,4-Diamino-6{2'-methylimidazole-(1')}ethyl-s-triazine | 7 parts |
| Dicyandiamide | 8 parts |
| Talc powder L-1 (filler, average particle size 2 μm, mfd. by Nippon Talc Co., Ltd.) | 10 parts |
| Aerosil 200 (thixotropic agent, ultrafine powder of quartz, average particle size 0.016 μm, mfd. by Nihon Aerosil Co., Ltd.) | 3 parts |
| Aerosil C (thixotropic agent, ultrafine powder of alumina, average particle size 0.02 μm, mfd. by Nihon Aerosil Co., Ltd.) | 2 parts |
| Silicone oil SC-5540 (anti-foaming agent, mfd. by Toray Silicone Co., Ltd.) | 2 parts |
| Phthalocyanine green (colorant) | 1.5 parts |

The above-mentioned ingredients were kneaded by using a mixing and grinding machine, followed by sufficient kneading using a three-roll mill to give a solventless one-liquid type solder resist ink composition having a thxotropy index of 23 and a viscosity of 5310 poises (20° C., 1 r.p.m.). The solder resist ink composition showed storage stability (usable time) of more than 30 days at 20° C.

The solder resist ink composition was printed by a screen printing method on a printed circuit substrate obtained by forming a pattern with a conductor of 0.3 to 20 mm wide with a conductor interval of 0.7 to 5 mm on a copper-clad epoxy-fiberglass substrate so as to expose a part of the conductor pattern. The solder resist ink composition was cured in a furnace at 130° C. for 30 minutes.

Then, the solder resist coated printed circuit substrate was immersed for 40 hours in an electroless copper plating bath having the following composition:

| | |
|---|---|
| $CuSO_4.5H_2O$ | 13 g/l. |
| EDTA.2Na* | 40 g/l. |
| NaOH | 11.5 g/l |
| Polyethylene glycol stearylamine | 0.1 g/l |
| α,α'-Dipyridyl | 5 mg/l |
| Formalin (37%) | 3 ml/l |
| Water | sufficient to make the volume 1 liter |
| Plating temperature | 70° C. |
| pH | 12.2 |

(Note)
EDTA.2Na = disodium ethylenediamine-tetraacetate

The plating bath was equipped with a device for automatically controlling the concentrations of the plating solution so as to make the concentrations of $Cu^{2+}$, formalin and EDTA.2Na and pH constant.

Then, the substrate was taken out of the plating bath, washed with water and dried in a furnace at 80° C. for 20 minutes.

The resulting solder resist film was not suffered from color change such as whitening, swelling, blisters, and peeling from the substrate. The adhesive strength of the solder resist film was evaluated by the cross-cut test wherein the resist film formed on the copper foil pattern was hatched with a sharp knife crosswisely with a pitch of 1 mm using a guide for the cross-cut test defined in Japanese Industrial Standards (JIS) K 5400, a pressure sensitive adhesive tape was applied to the hatched resist film and stuck sufficiently, the adhesive tape was separated at a breath at the direction of an angle of 45° from the resist film, and peeled state of the cross-cut resist film ws observed. No peeling of the resist film was admitted. Therefore, the adhesive strength of the resist film was evaluated as point 10 according to the cross-cut test evaluation.

After subjecting the substrate to fluxing treatment, the substrate was placed in a solder bath heated at 260° C. so that the solder resist film contacted with solder for 20 seconds (the soldering heat resistance). No blisters nor cracks were admitted on the solder resist film.

When the cross-cut test was conducted on the resulting solder resist film, no peeling was admitted and the evaluation was the point 10 according to JIS K 5400.

EXAMPLE 2

| | |
|---|---|
| Epikote 807 | 100 parts |
| 2,4-Diamino-6{2'-ethyl-4'-methylimidazole-(1')}ethyl-s-triazine | 5 parts |
| Dicyandiamide | 5 parts |
| Alumina powder C (average particle size 1 μm, mfd. by Fujimi Kenma Kogyo K.K.) | 20 parts |
| Aerosil 200 | 3 parts |
| Aerisil C | 2 parts |
| Silicone oil SC-5540 | 2 parts |
| Phthalocyanine green | 1.5 parts |

The above-mentioned ingredients were kneaded in the same manner as described in Example 1 to give a solventless one-liquid type solder resist ink composition having a thixotropy index of 21 and a viscosity of 4300 poises (20° C., 1 r.p.m.). The solder resist ink composition showed storage stability of more than 30 days at 20° C.

A solder resist film was formed by using the solder resist ink composition and evaluated in the resistance to electroless plating bath and the soldering heat resistance in the same manner as described in Example 1. No abnormality such as color change, blisters, cracks, and peeling was produced on the solder resist film. The cross-cut test after soldering was evaluated as the point 10.

EXAMPLE 3

| | |
|---|---|
| Epikote 807 | 100 parts |
| 2,4-Diamino-6{2'-undecyl-imidazole-(1')}ethyl-s-triazine | 5 parts |
| Dicyandiamide | 7 parts |
| Barium sulfate powder #300 (average particle size 0.8 μm, mfd. by Sakai Chemical Industry Co., Ltd.) | 35 parts |
| Aerosil 200 | 3 parts |
| Aerosil C | 2 parts |
| Silicone oil SC-5540 | 1 part |
| Phthalocyanine green | 1.5 parts |

The above-mentioned ingredients were kneaded in the same manner as described in Example 1 to give a solventless one-liquid type solder resist ink composition having a thixotropy index of 20 and a viscosity of 5320 (20° C., 1 r.p.m.). The solder resist ink composition showed storage stability of more than 30 days at 20° C.

A solder resist film was formed by using the solder resist ink composition and evaluated in the resistance to electroless plating bath and the soldering heat resistance in the same manner as described in Example 1. No abnormality such as color change, blisters, cracks and peeling was produced on the solder resist film. The cross-cut test after soldering was evaluated as the point 10.

EXAMPLE 4

| | | |
|---|---|---|
| Epikote 807 | 50 parts | |
| Epikote 828 (bisphenol A type epoxy resin, mfd. by Shell Chemical Co., Ltd., epoxy equivalent weight 189) | 50 parts | |
| 2,4-Diamino-6{2'-methyl-imidazole-(1')}ethyl-s-triazine.isocyanuric acid adduct | 5 parts | |
| Dicyandiamide | 7 parts | |
| Quartz powder, Crystalite VXX (average particle size 1 μm, mfd. by Tatsumori K.K.) | 10 parts | |
| Aerosil RY 200 (quartz ultrafine powder treated with silicone oil, mfd. by Nihon Aerosil Co., Ltd.) | 5 parts | |
| Silicone oil SC-5400 | 2 parts | |
| Phthalocyanine green | 1.5 parts | |

The above-mentioned ingredients were kneaded in the same manner as described in Example 1 to give a solventless one-liquid type solder resist ink having a thixotropy index of 15 and a viscosity of 6340 poises (20° C., 1 r.p.m.). The solder resist ink composition showed storage stability of more than 30 days at 20° C.

A solder resist film was formed by using the solder resist ink composition and evaluated in the resistance to electroless plating bath and the soldering heat resistance in the same manner as described in Example 1. No abnormality such as color change, blisters, cracks and peeling was produced on the solder resist film. The cross-cut test after soldering was evaluated as the point 10.

EXAMPLE 5

| | | |
|---|---|---|
| Epikote 807 | 100 parts | |
| 2,4-Diamino-6{2'-methylimidazole-(1')}ethyl-s-triazine | 2.5 parts | |
| Dicyandiamide | 7 parts | |
| Pyrogallol | 0.5 part | |
| Quartz powder, Crystalite VXX | 20 parts | |
| Aerosil RY-200 surface treated with a silicone oil | 5 parts | |
| Silicone oil SC-5540 | 2 parts | |
| Phthalocyanine green | 1.5 parts | |

The above-mentioned ingredients were kneaded in the same manner as described in Example 1 to give a solventless one-liquid type solder resist ink having a thixotropy index of 22 and a viscosity of 5520 poises (20° C., 1 r.p.m.). The solder resist ink composition showed storage stability of 90 days or more at 20° C. as shown in the attached drawing. As shown in the drawing, almost no change was admitted as to the values of $\eta_1$, $\eta_{100}$, and $\eta_1/\eta_{100}$ (thixotropy index).

A solder resist film was formed by using the solder resist ink composition and evaluated in the resistance to electroless plating bath and the soldering heat resistance in the same manner as described in Example 1. No abnormality such as color change, blisters, cracks and peeling was produced on the solder resist film. The cross-cut test before and after soldering was evaluated as the point 10, respectively.

As mentioned above, the epoxy resin composition of this invention has excellent storage stability (usable life) of more than 30 days and sometimes 90 days or more, excellent resistance to the electroless plating bath, that is, showing no abnormality of the solder resist such as degradation, color change, e.g. whitening, swelling, blisters, peeling from the substrate, etc., excellent printing properties, excellent adhesion to the substrate and conductors, and excellent soldering heat resistance.

What is claimed is:

1. An epoxy resin composition comprising
    (a) 100 parts by weight of an epoxide compound having more than one epoxy group on the average per molecule,
    (b) 1 to 20 parts by weight of a diaminotriazine-modified imidazole compound represented by the formula:

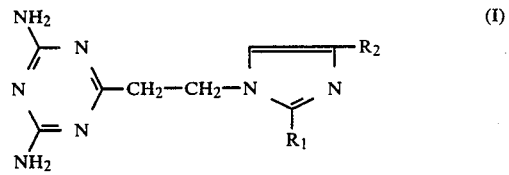

(I)

wherein $R_1$ is an alkyl group having 1 to 20 carbon atoms or a phenyl group; and $R_2$ is a hydrogen atom or a lower alkyl group, or an acid adduct thereof,
    (c) dicyandiamide in an amount of 0.2 to 2.0 equivalent weight per epoxy equivalent weight of the epoxide compound (a),
    (d) 3 to 40 parts by weight of a filler,
    (e) 0.5 to 10 parts by weight of an anti-foaming agent, and
    (f) a thixotropic agent in an amount of making a thixotropy index of the whole composition 5 to 40 and a viscosity of the whole composition 800 to 10,000 poises when measured by using a B type rotational viscometer at a rotational rate of 1 r.p.m. at 20° C., whereby said composition has a storage stability of at least 30 days and cures at temperatures as low as 130° C., and has good screen printing properties, and provides a cured product that has excellent resistance to electroless plating baths and to soldering heat.

2. An epoxy resin composition according to claim 1, wherein $R_1$ in the formula (I) is a methyl group, an ethyl group, an isopropyl group, an undecyl group, an heptadecyl group, or a phenyl group and $R_2$ in the formula (I) is a hydrogen atom or a methyl group.

3. An epoxy resin composition according to claim 1, wherein the component (b) is 2,4-diamino-6{2'-methylimidazole-(1')}ethyl-s-triazine, 2,4-diamino-6{2'-ethyl-4'-methylimidazole-(1')}ethyl-s-triazine, 2,4-diamino-6{2'-undecylimidazole-(1')}ethyl-s-triazine, or 2,4-diamino-6{2'-methylimidazole-(1')}ethyl-s-triazine.isocyanuric acid adduct.

4. An epoxy resin composition according to claim 1, wherein the component (a) is a polyglycidyl ether obtained by reacting epichlorohydrin with a polyhydric phenol in the presence of a basic catalyst.

5. An epoxy resin composition according to claim 4, wherein the polyhydric phenol is bisphenol A, a halogenated bisphenol A or bisphenol F.

6. An epoxy resin composition according to claim 1, wherein the component (d) is a fine powder of talc, mica, alumina, barium sulfate, silica or titanium oxide, or a mixture thereof.

7. An epoxy resin composition according to claim 6, wherein the component (d) has an average particle size of 10 μm or less.

8. An epoxy resin composition according to claim 1, wherein the component (e) is a silicone oil.

9. An epoxy resin composition according to claim 1, wherein the component (f) is a $SiO_2$, or $Al_2O_3$ powder having an average particle size of 1 μm or less surface treated with or not treated with a silicone oil.

10. An epoxy resin composition according to claim 9, wherein the powders have a particle size of 0.1 μm or less.

11. An epoxy resin composition according to claim 1, wherein the acid component, for forming said acid adduct, is selected from the group consisting of methyl isocyanurate, ethyl isocyanurate, propyl isocyanurate and butyl isocyanurate.

12. An epoxy resin composition according to claim 1, wherein said composition is a solventless composition.

13. An epoxy resin composition comprising
(a) 100 parts by weight of an epoxide compound having more than one epoxy group on the average per molecule,
(b) 1 to 20 parts weight of a diaminotriazine-modified imidazole compound represented by the formula:

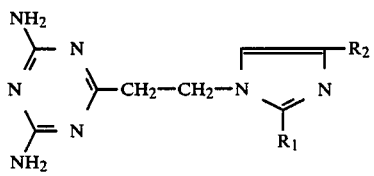

wherein $R_1$ is an alkyl group having 1 to 20 carbon atoms or a phenyl group; and $R_2$ is a hydrogen atom or a lower alkyl group, or an acid adduct thereof,
(c) dicyandiamide in an amount of 0.2 to 2.0 equivalent weight per epoxy equivalent weight of the epoxide compound (a),
(d) 3 to 40 parts by weight of a filler,
(e) 0.5 to 10 parts by weight of an anti-foaming agent,
(f) a thixotropic agent in an amount of making a thixotropy index of the whole composition 5 to 40 and a viscosity of the whole composition 800 to 10,000 poises when measured by using a B type rotational viscometer at a rotational rate of 1 r.p.m. at 20° C., and
(g) 0.1 to 8 parts by weight of a phenolic compound, wherein said composition has a storage stability of at least 30 days and cures at temperatures as low as 130° C., and has good screen printing properties, and provides a cured product that has excellent resistance to electroless plating baths and to soldering heat.

14. An epoxy resin composition according to claim 13, wherein $R_1$ in the formula (I) is a methyl group, an ethyl group, an isopropyl group, an undecyl group, an heptadecyl group, or a phenyl group and $R_2$ in the formula (I) is a hydrogen atom or a methyl group.

15. An epoxy resin composition according to claim 13, wherein the component (b) is 2,4-diamino-6{2'-methylimidazole-(1')}ethyl-s-triazine, 2,4-diamino-6{2'-ethyl-4'-methylimidazole-(1')}ethyl-S-triazine, 2,4-diamino-6{2'-undecylimidazole-(1')}ethyl-s-triazine, or 2,4-diamino-6{2'-methylimidazole-(1')}ethyl-s-triazine.isocyanuric acid adduct.

16. An epoxy resin composition according to claim 13, wherein the component (f) is an ultrafine powder of $SiO_2$ or $Al_2O_3$ surface treated with a silicone oil.

17. An epoxy resin composition according to claim 13, wherein the phenolic compound is pyrogallol, resorcinol, catechol, hydroquinone, hydroxyhychoquinone, phloroglucinol, or phenol.

18. An epoxy resin composition according to claim 13, wherein the component (e) is a silicone oil and the thixotropic agent (f) is surface treated with a silicone oil.

19. An epoxy resin composition according to claim 18, wherein the silicone oil is a polyphenylsiloxane.

20. An epoxy resin composition according to claim 13, wherein the component (a) is a polyglycidyl ether obtained by reacting epichlorohydrin with a polyhydric phenol in the presence of a basic catalyst.

21. An epoxy resin composition according to claim 20, wherein the polyhydric phenol is bisphenol A, a halogenated bisphenol A or bisphenol F.

22. An epoxy resin composition according to claim 13, wherein the component (d) is a fine powder of talc, mica, alumina, barium sulfate, silica or titanium oxide, or a mixture thereof.

23. An epoxy resin composition according to claim 22, wherein the component (d) has an average particle size of 10 μm or less.

24. An epoxy resin composition according to claim 13, wherein the component (f) is a $SiO_2$ or $Al_2O_3$ powder having an average particle size of 1 μm or less surface treated with or not treated with a silicone oil.

25. An epoxy resin composition according to claim 24, wherein the powders have a particle size of 0.1 μm or less.

26. An epoxy resin composition according to claim 13, wherein said composition is a solventless composition.

* * * * *